(12) United States Patent
Oosawa

(10) Patent No.: US 8,503,132 B2
(45) Date of Patent: Aug. 6, 2013

(54) HEAD GIMBAL ASSEMBLY, SLIDER, AND METHOD OF MANUFACTUING A HEAD GIMBAL ASSEMBLY WITH REDUCED LEAD LENGTH

(75) Inventor: Eiki Oosawa, Kanagawa (JP)

(73) Assignee: HGST Netherlands B.V., Amsterdam (NL)

( * ) Notice: Subject to any disclaimer, the term of this patent is extended or adjusted under 35 U.S.C. 154(b) by 1419 days.

(21) Appl. No.: 11/509,972

(22) Filed: Aug. 25, 2006

(65) Prior Publication Data

US 2007/0047144 A1 Mar. 1, 2007

(30) Foreign Application Priority Data

Aug. 25, 2005 (JP) ................................. 2005-244144
Aug. 25, 2005 (JP) ................................. 2005-244145

(51) Int. Cl.
*G11B 5/60* (2006.01)
(52) U.S. Cl.
USPC ..................................................... 360/234.5

(58) Field of Classification Search
None
See application file for complete search history.

(56) References Cited

U.S. PATENT DOCUMENTS

| 5,530,604 | A | | 6/1996 | Pattanaik | |
|---|---|---|---|---|---|
| 5,828,031 | A | * | 10/1998 | Pattanaik | 219/121.63 |
| 6,046,882 | A | * | 4/2000 | Pattanaik et al. | 29/878 |
| 6,927,946 | B2 | * | 8/2005 | Shum et al. | 360/294.3 |

* cited by examiner

*Primary Examiner* — David D Davis

(57) ABSTRACT

A head gimbal assembly for a hard disk drive includes a head slider having a head element part which performs reading and/or writing of data to/from a magnetic disc and a suspension on which the head slider is mounted. Bonding pads formed on the head slider are formed on a side surface of the head slider except for an air bearing surface (ABS) which faces the magnetic disc and a back surface on a side opposite to the ABS. End peripheries of the bonding pads are arranged to be in contact with an end periphery of the side surface of the head slider which abuts on the back surface of the head slider.

7 Claims, 7 Drawing Sheets

(a)

(b)

(a)

(b)

(a)

(b)

Prior Art

HEAD GIMBAL ASSEMBLY, SLIDER, AND METHOD OF MANUFACTUING A HEAD GIMBAL ASSEMBLY WITH REDUCED LEAD LENGTH

RELATED APPLICATIONS

The present application claims priority to Japanese Patent Applications, 2005/244144 and 2005/244145, filed Aug. 25, 2005, the entire contents of both are incorporated by reference herein.

BACKGROUND OF THE INVENTION

The present invention relates to a head gimbal assembly (HGA) which includes a head slider and a suspension which supports the head slider, and more particularly to a technique which electrically connects the head slider and the suspension.

A magnetic disc device includes a magnetic disc which stores data and a head slider which gets access to the magnetic disc. In the head slider, a head element part which performs the reading and/or the writing of data between the head slider and the magnetic disc is formed. The head element part includes a recording element which converts an electric signal into a magnetic field in response to recording data to the magnetic disc to an electric signal. The magnetic disc device further includes a head arm which moves the head slider to a desired position on the magnetic disc. The head arm is driven by a voice coil motor (VCM). By rotating the head arm about a rotary shaft, the head slider is moved in the radial direction of the magnetic disc. Accordingly, the head element part can access a desired track formed on the magnetic disc and perform the reading/writing process of data.

The head arm includes a suspension which possesses resiliency, while the head slider is fixed to the suspension using an adhesive agent. By establishing a balance between the pressure attributed to the viscosity of air between an air bearing surface (ABS) of the head slider which faces the magnetic disc in an opposed manner and the rotating magnetic disc and the pressure which is applied in the magnetic disc direction due to the suspension, it is possible to allow the head slider to float over the magnetic disc with a fixed gap. The parts constituting the head slider and the suspension which supports the head slider are referred to as a head gimbal assembly (HGA).

FIG. 7 shows an example of an HGA as viewed from a recording surface side of the magnetic disc. As shown in FIG. 7, the HGA 400 includes a head slider 401, a suspension 402 and a lead 403. The lead 403 is conductive wiring for transmitting signals between a head element part (not shown in the drawing) formed on the head slider 401 and an amplifying part (not shown in the drawing). The suspension 402 includes a flexible flexure 404 which holds the head slider 401 on a magnetic-disc-facing-surface side, and a load beam 405 which holds the flexure 404 on the magnetic-disc-facing-surface side. The HGA 400 shown in the drawing is of a loading/unloading type, wherein a tab 406 which contacts a ramp mechanism is provided to a distal end of the load beam 405. A plurality of bonding pads are connected to the head element part and formed on a front surface (tab side) of the head slider 401. The respective bonding pads of the head slider 401 and the bonding pads formed on a distal end of the lead 403 are connected with each other by ultrasonic bonding which uses gold balls, solder ball bonding (SBB) which bonds the bonding pads by reflowing solder balls or the like. Among these bonding techniques, the technique to join the head slider and the lead by the ultrasonic bonding using gold balls or the like is disclosed in JP-A-2000-251217 (Patent document 1) for example.

In the conventional magnetic disc device, the lead which connects the head element part and the amplifying part requires 2 lines for transmitting recording signals and 2 lines for transmitting reproducing signals, that is, 4 lines in total. In this case, the number of bonding pads formed on the head slider is 4. However, a head slider having a TFC (Thermal Flying height Control) technique requires additional lines and hence, it is necessary to form at least 6 bonding pads on the head slider.

FIG. 8(a) is a view showing a side end surface of a conventional head slider 401 on which 6 bonding pads are formed. Further, FIG. 8(b) is a cross-sectional view taken along a line P-Q in FIG. 8(a). As shown in FIG. 8(a), on the side end surface 401c of the head slider 401, 6 bonding pads 408 which connect the head element part 407 and the leads 403 are formed. To be more specific, as shown in FIG. 8(b), the bonding pad 408 is formed on a surface of a protective film 411 made of alumina ($Al_2O_3$). The protective film 411 is formed on a side surface of a head slider body 410 made of ALTIC (AlTiC) and plays a role of protecting the head element part 407. Here, ALTIC is a sintered body of aluminum (Al), titanium (Ti) and carbon (C) and is a type of ceramic which is obtained by baking alumina, titanium carbide.

Further, the bonding pads 408 are formed at a position which is spaced apart from a back surface 401b of the head slider 401 by a predetermined distance A (A>0). Here, the back surface 401b is a surface on a side opposite to an ABS 401a which is a surface floating above the magnetic disc. On the other hand, bonding pads 409 are formed on an end portion of the leads 403 and are electrically connected with the bonding pads 408 formed on the head slider 401. Here, as shown in FIG. 8(b), a bonding surface of the bonding pads 409 is formed to be substantially orthogonal to the side surface 401c of the head slider 401 and the bonding surface of the bonding pads 408. Further, the bonding pads 408 and the bonding pads 409 are spaced apart from each other by a predetermined distance D (D>0). Hereinafter, the distance D is referred to as pad clearance. In the conventional HGA, the pad clearance is set to approximately several ten μms.

In the connection using solder such as solder ball bonding or the like, it is necessary to avoid the occurrence of defective connection. The defective connection implies a state in which pads are not yet electrically connected or the connection between pads is insufficient. The increase of defective connection in the solder ball bonding leads to the lowering of a yield rate of the HGA manufacturing steps.

As described above, the number of lines to be connected to the head slider is increasing. When the number of lines connected to the head slider is increased, it is necessary to increase the number of bonding pads formed on the surface of the head slider and hence, the restriction imposed on the size of respective bonding pads becomes stricter. For example, with respect to a size of a side surface of a femto head slider, a width of the slider is 0.7 mm or less and a height of the slider is 0.23 mm or less and hence, to form 6 bonding pads on the head slider, it is necessary to restrict a width of the pads to approximately 80 μm. In bonding these bonding pads using solder balls, a diameter of the solder balls becomes approximately 90 μm.

When the size of the bonding pads which contribute to the connection by soldering becomes small due to the increase of the number of pads formed on the head slider, the miniaturization of the head slider or the like, there arises a drawback that a yield rate is deteriorated due to the increase of defective connections. It is known that the occurrence ratio of defective connections at the time of bonding using soldering depends on the distance between the bonding pads formed on the head slider and the bonding pads formed on the suspension-side leads.

Here, in the connection using gold balls, there exists no dependency relationship between the defective connections such as the connections using solders and the distance between the bonding pads. In case of gold ball bonding, the bonding of the bonding pads and the gold balls is performed in a state that a spherical shape of the gold ball is substantially maintained and hence, even when the pad clearance is set to a value close to a radius of the gold ball, the occurrence ratio of the defective connection is not changed.

SUMMARY OF THE INVENTION

The present invention has been made under such circumstances and it is an object of the present invention to provide a head gimbal assembly which can reduce the occurrence of defective connections in a step in which a head slider and a suspension are electrically connected with each other and a head slider which is applicable to the head gimbal assembly.

According to an aspect of the present invention, there is provided a head gimbal assembly which includes a head slider having a head element part which performs reading and/or writing of data between the head element part and a magnetic disc, and a suspension on which the head slider is mounted. The head slider includes a plurality of first bonding pads, while the suspension includes conductive leads which have a plurality of second bonding pads on one end thereof, wherein the second bonding pads are bonded to the first bonding pads by a conductive bonding material. The first bonding pads are formed on a side surface of the head slider except for an air bearing surface which faces the magnetic disc and a back surface on a side opposite to the air bearing surface. Further, end peripheries of the first bonding pads are brought into contact with an end periphery of the side surface which abuts on the back surface.

Due to such construction, it is possible to reduce a distance between the bonding pads on the head slider side and the bonding pads on the lead side and hence, the occurrence of connection failure for electrically connecting the head slider and the suspension with each other can be reduced. The bonding material may be solder and an angle which is made by a bonding surface of the first bonding pads and the bonding surface of the second bonding pads may be set to approximately 90 degrees. Due to such construction, it is possible to enhance the stability in temporarily mounting a bonding material such as solder balls on the pads. The leads may be arranged in a state that the bonding surface of the second bonding pads extends to a position which faces a back surface of the head slider in an opposed manner thereby reducing the distance between the bonding pads on the head slider side and the bonding pads on the lead side. The leads may be arranged in a state that an insulating protective film which forms the first bonding pads on a surface thereof and distal end portions of the second bonding pads face each other in an opposed manner thereby preventing short-circuiting between the leads and the conductive head slider body.

According to another aspect of the present invention, there is provided a head slider which includes a head element part which performs reading and/or writing of data between the head element part and a magnetic disc. The head slider includes bonding pads which are connected with conductive leads which are formed on a suspension on which the head slider is mounted by a conductive bonding material. The bonding pads are formed on a side surface of the head slider except for an air bearing surface which faces the magnetic disc and a back surface on a side opposite to the air bearing surface. Further, end peripheries of the bonding pads are brought into contact with an end periphery of the side surface which abuts on the back surface.

Due to such construction, it is possible to reduce a distance between the bonding pads on the head slider side and the bonding pads on the lead side and hence, the occurrence of connection failure in a step for electrically connecting the head slider and the suspension with each other can be reduced.

According to another aspect of the present invention, there is provided a method of manufacturing a head gimbal assembly in which a head slider is supported on a suspension. Firstly, on a side surface of the head slider except for an air bearing surface which faces a magnetic disc and a back surface on a side opposite to be air bearing surface, first bonding pads are formed in a state that the first bonding pads are brought into contact with an end periphery of the side surface which abuts the back surface. Next, to the suspension including conductive leads which form second bonding pads on one end thereof for connecting the conductive leads to the head slider, the head slider is fixed. Finally, the first bonding pads and the second bonding pads are bonded to each other by a conductive bonding material.

Due to such a method, it is possible to connect the pads to each other in a state that a distance between the bonding pads on a head slider side and the bonding pads on a lead side is reduced. Accordingly, the occurrence of connection failure in a step for electrically connecting the head slider and the suspension with each other can be reduced. The bonding material may be formed of solder balls, and the first bonding pads and the second bonding pads may be connected with each other by reflowing the solder balls. An angle which is made by a bonding surface of the first bonding pads and the bonding surface of the second bonding pads is set to approximately 90 degrees to thereby enhance the stability in temporarily mounting a bonding material such as solder balls on the pads. The head slider may be fixed to the suspension in a state that a bonding surface of the second bonding pads and a back surface of the head slider face each other in an opposed manner thereby reducing the distance between the bonding pads on the head slider side and the bonding pads on the lead side and hence, the occurrence of connection failure for electrically connecting the head slider and the suspension with each other can be reduced. The head slider may be fixed at a position where an insulating protective film which forms the first bonding pads on a surface thereof and distal end portions of the second bonding pads face each other thereby preventing short-circuiting between the lead and the conductive head slider body.

According to another aspect of the present invention, a head gimbal assembly comprises: a head slider having a head element part for reading and/or writing data from/on a magnetic disk and a suspension on which the head slider is mounted. The head slider has a plurality of first bonding pads formed on a side surface of the head slider, the side surface being other than an air bearing surface opposed to the magnetic disk and a backside which is a reverse side of the air bearing surface; the suspension has an electroconductive lead provided with a plurality of second bonding pads formed on one end of the electroconductive lead, the second bonding pads being bonded with the first boding pads with an electroconductive bonding material; and the lead is extended to a position at which a bonding surface of the second bonding pads is opposed to the backside of the head slider. Accordingly, a distance between the bonding pads on the head slider and the bonding pads on the lead is reduced and the occurrence of a poor connection in a process of electrically connecting the head slider and the suspension to each other is reduced. The bonding material may be solder.

According to another aspect of the present invention is a method of producing a head gimbal assembly wherein a head slider is supported by a suspension, the method comprising: forming a plurality of first bonding pads on the side surface of the head slider, the side surface being other than an air bearing surface opposed to the magnetic disk and a backside which is a reverse side of the air baring surface; fixing the head slider to the suspension in such a fashion that a bonding surface of second bonding pads and the backside of the head slider are opposed to the suspension having an electroconductive lead provided with the second bonding pads which are formed on one end of the electroconductive lead to be connected to the head slider; and bonding the first boding pads and the second bonding pads to each other with the use of an electroconductive bonding material.

With such method, the bonding pads on the head slider and the bonding pads on the lead are connected to each other with a distance therebetween being minimized. Therefore, the occurrence of poor connection in a process of electrically connecting the head slider and the suspension to each other is reduced.

According to the present invention, it is possible to provide the head slider and the head gimbal assembly which can reduce the occurrence of connection failures in a step which electrically connects the head slider and the suspension.

BRIEF DESCRIPTION OF THE DRAWINGS

Embodiments of the invention will now be described in detail, by way of example, with reference to the accompanying drawings, in which:

FIG. 3a is an elevational view of the HGA according to the present invention;

FIG. 3b is a side elevational view taken along line P-Q of FIG. 3a;

FIG. 6a is an elevational view of the HGA shown in FIG. 5;

FIG. 6b is a side elevational view taken along line P-Q of FIG. 6a;

FIG. 8a is an elevational view of an prior art HGA; and

FIG. 8b is a side elevational view taken along line P-Q of FIG. 8a.

DETAILED DESCRIPTION

Hereinafter, specific embodiments to which the present invention is applied are explained in detail in conjunction with the drawings. Here, in respective drawings, the same symbols are given to identical elements and, for the sake of clarifying the explanation, repeated explanations are omitted.

Figure 1:
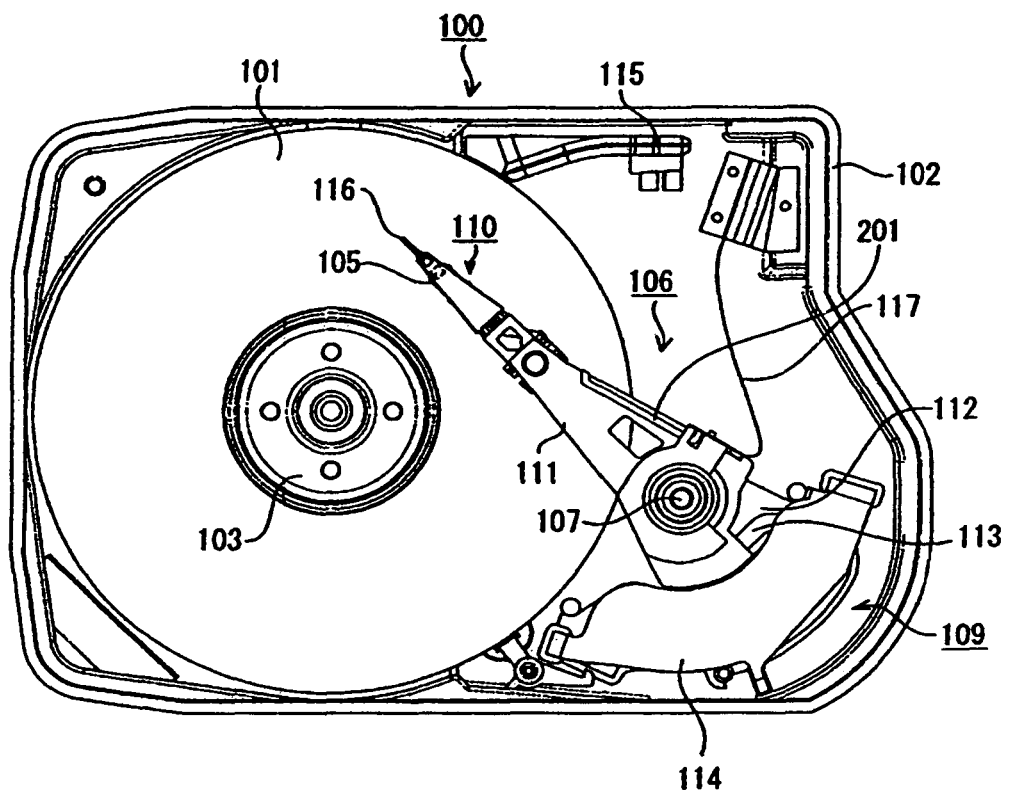
FIG. 1 illustrates a magnetic disc drive device utilizing the present invention.

First of all, for facilitating the understanding of the present invention, the overall constitution of a magnetic disc device is explained. FIG. 1 is a plan view which schematically shows a magnetic disc device 100 according to this embodiment. The magnetic disc device 100 includes a magnetic disc 101 for recording data. The magnetic disc 101 is a non-volatile memory which records data by the magnetization of a magnetic layer. Respective constitutional elements of the magnetic disc device 100 are accommodated in the inside of a base 102. The base 102 is fixed by way of a cover (not shown in the drawing) which closes an upper opening of the base 102 and a gasket (not shown in the drawing) thus constituting a disc enclosure whereby the base 102 can accommodate the respective constitutional elements of the magnetic disc device 100 in a hermetically sealed state.

The magnetic disc 101 is fixed to a spindle motor (SPM) 103. A head slider 105 includes a head element part which performs writing and/or reading of data which is inputted or outputted between a host (not shown in the drawing) and the magnetic disc 101. The head element part includes a recording element which converts an electric signal to a magnetic field in response to the stored data to the magnetic disc 101 and/or a reproducing element which converts the magnetic field from the magnetic disc 101 into an electric signal.

A head arm 106 holds and moves the head slider 105. The head arm 106 is rotatably held on a rotary shaft 107 and is driven by a VCM (voice coil motor) 109 which constitutes a driving mechanism. The head arm 106 includes the respective constitutional members of a suspension 110, an arm 111, a coil support 112 and a flat coil 113. The VCM 109 has the flat coil 113, a stator magnet (not shown in the drawing) which is fixed to an upper stator magnet holding plate 114 and a stator magnet (not shown in the drawing) which is fixed to a lower stator magnet holding plate.

The magnetic disc 101 is integrally held on the SPM 103 which is fixed to a bottom surface of the base 102 and is rotatably driven at a predetermined speed by the SPM 103. The magnetic disc 101, in FIG. 1, rotates in the counterclockwise direction. When the magnetic disc device 100 is not operated, the magnetic disc 101 is held in a still state. The VCM 109 rotates the head arm 106 about the rotary shaft 107 in the direction perpendicular to the shorter direction of the head arm 106 in response to a drive signal supplied to the flat coil 113 from a controller (not shown in the drawing). Accordingly, the head arm 106 moves the head slider 105 over the magnetic disc 101 or moves the head slider 105 to the outside of the magnetic disc 101.

For performing the reading/writing of data from/to the magnetic disc 101, the head arm 106 moves the head slider 105 over a data region on a surface of the rotating magnetic disc 101. Along with the rotation of the head arm 106, the head slider 105 moves along the radial direction on the surface of the magnetic disc 101. Accordingly, the head slider 105 can access a desired track. The transmission of the signal between the head slider 105 and the controller is performed by a lead 201 which constitutes a conductive line and a flexible printed wiring board (FPC) 117. By establishing a balance between pressure which is generated due to the viscosity of air between an ABS (Air Baring Surface) of the head slider which faces the magnetic disc 101 in an opposed manner and the rotating magnetic disc 101 and pressure which is applied in the magnetic disc 101 direction by the suspension 110, the head slider 105 floats above the magnetic disc 101 with a gap therebetween.

When the rotation of the magnetic disc 101 is stopped, the head slider 105 is brought into contact with the surface of the magnetic disc 101 and gives rise to a drawback such as the occurrence of flaws in the data region due to an attraction phenomenon, a phenomenon that the magnetic disc cannot be rotated and the like. Accordingly, when the rotation of the magnetic disc 101 is stopped, the head arm 106 is retracted to a ramp mechanism 115 from the data region. When the head arm 106 is rotated in the direction toward the ramp mechanism 115, a tab 116 mounted on the distal end portion of the head arm 106 is slidably moved on a surface of the ramp mechanism 115, and the tab 116 is landed on a parking surface on the ramp mechanism 115, the head slider 105 is unloaded. At the time of loading, the head arm 106 which is supported on the parking surface is removed from the ramp mechanism 115 and is moved to the surface of the magnetic disc 101.

Here, it is also possible to apply the present invention to a CSS (Contact Start and Stop) system in which when the head slider 105 does not perform the data writing/reading processing, the head slider 105 is retracted in a zone which is arranged on an inner periphery of the magnetic disc 101. Further, in the above-mentioned explanation, for the sake of brevity, the explanation is made with respect to the magnetic disc device which uses a single magnetic disc 101. However, the magnetic disc device 100 may include one or a plurality of two-sided recording magnetic discs.

Figure 7:
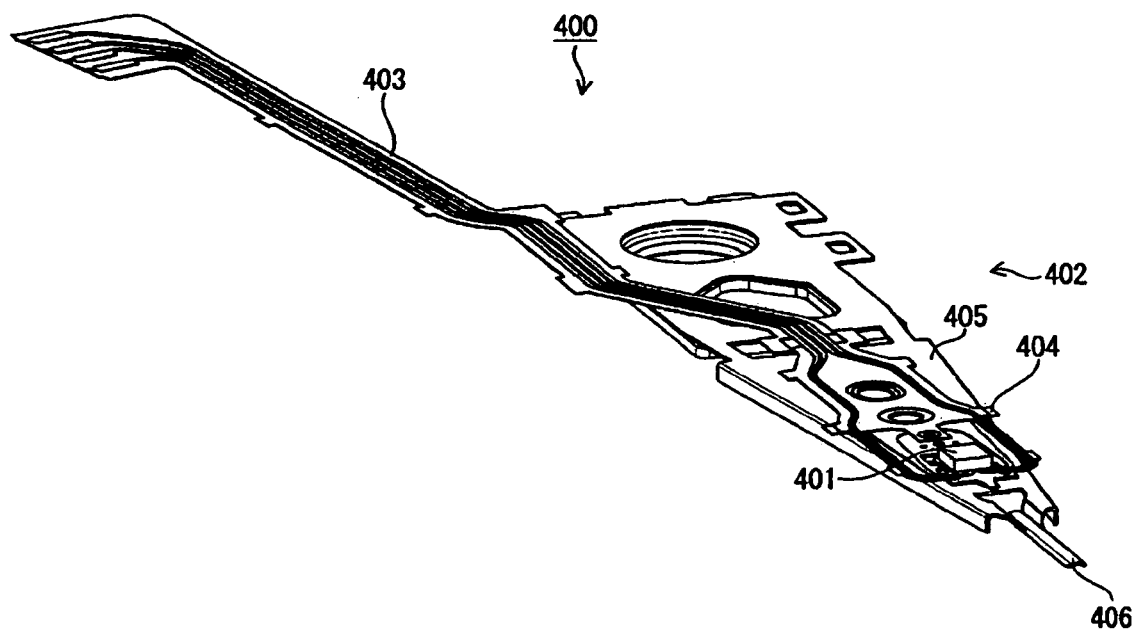
FIG. 7 is a perspective view of an HGA.

Next, an HGA 200 according to the present invention is explained with reference to FIG. 2. The HGA 200 includes the head slider 105, a flexure 202, a load beam 203 and a leads 201. Here, parts not shown in FIG. 2 have the same construction as the corresponding parts of the conventional HGA 400 shown in FIG. 7 and the detailed explanation of these parts is omitted.

The leads 201 are conductive lines which transmit a recording signal and/or a reproducing signal between the head element part 122 which is formed on the head slider 105 and an amplifying part (not shown in the drawing) of the magnetic disc device 100. The flexible flexure 202 holds the head slider 105. The load beam 203 holds the flexure 202. An assembly having the load beam 203, the flexure 202 and the leads 201 forms the suspension 110.

The head element part 122 which is formed on a side surface of the head slider 105 is protected by an insulating protective film 121 made of alumina ($Al_2O_3$). On a surface of the protective film 121, plural bonding pads 123 are formed for establishing the electrical connection between the head element part 122 and the leads 201. The number of bonding pads 123 in this embodiment is 6 pads.

Bonding pads 204 are formed on end portions of the leads 201. The bonding pads 123 and the bonding pads 204 are connected by solder ball bonding. Here, a bonding surface of the bonding pad 204 is formed such that an angle made by the bonding surface of the bonding pad 204 and a bonding surface of the bonding pad 123 formed on the side surface of the head slider 105 becomes substantially 90 degrees. By setting such an angle to approximately 90 degrees, it is possible to enhance the stability at the time of temporally placing a bonding material such as a solder ball on the bonding pad.

Figure 2:
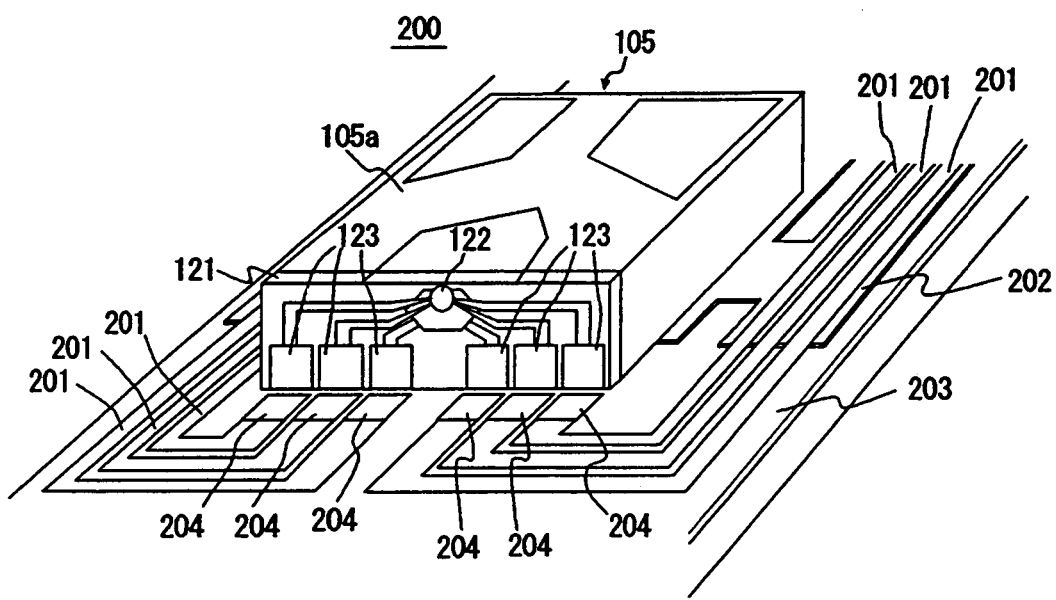
FIG. 2 is a perspective view of an HGA according to the present invention.
Figure 3:
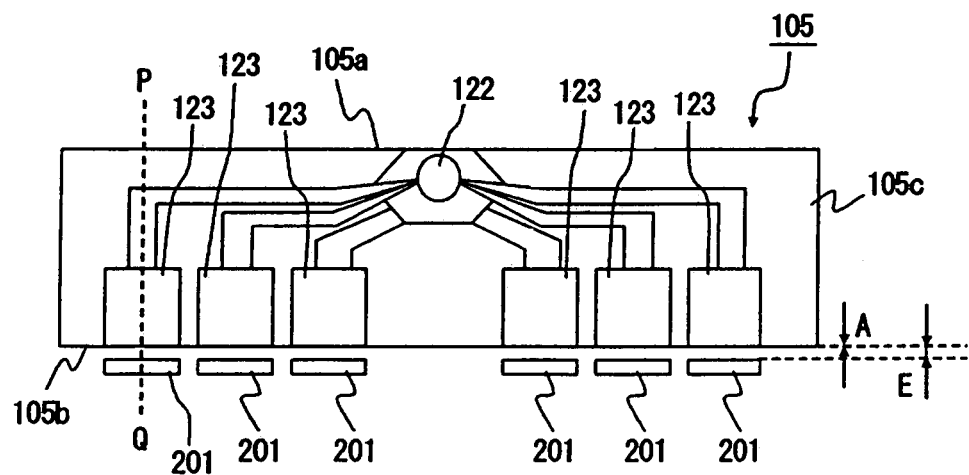
Figure 3:
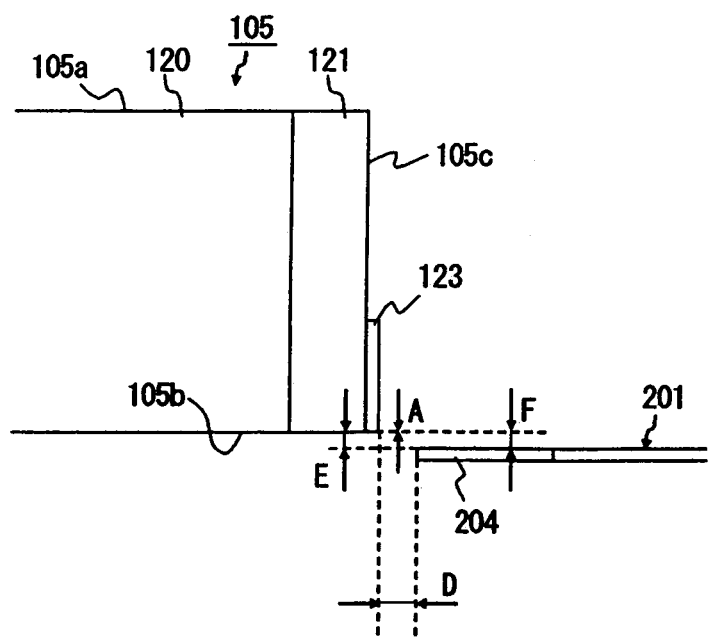
Figure 6:
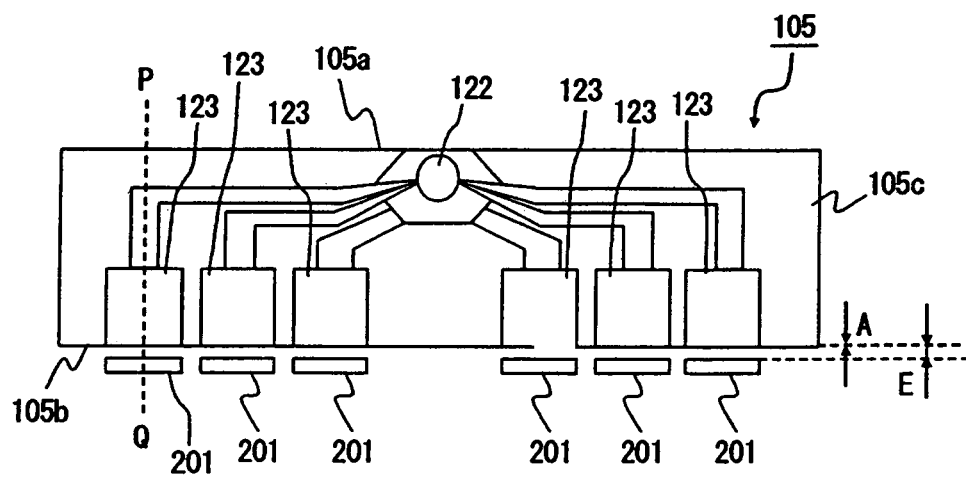
Figure 6:
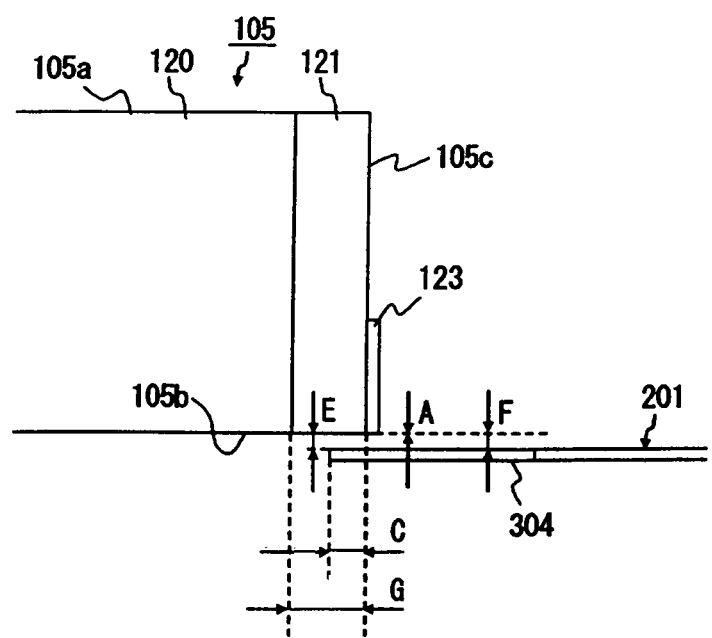

FIG. 3(a) is a view which shows a side end surface of the head slider 105 shown in FIG. 2. Further, FIG. 3(b) is a cross-sectional view taken along a line P-Q in FIG. 3(a). As shown in FIG. 3(a), 6 bonding pads 123 are formed on the side surface 105c of the head slider 105. To be more specific, as shown in FIG. 3(b), the bonding pads 123 are formed on the surface of the protective film 121 made of alumina. The protective film 121 is formed on a side surface of a head slider body 120 made of ALTIC (AlTiC) and plays a role of protecting the head element part 122.

Further, the head slider 105 of this embodiment is characterized by the bonding pads 123 being formed at a position where end peripheries of the bonding pads 123 are brought into contact with an end periphery of the slider side surface 105c which abuts a back surface 105b of the head slider 105. Here, the back surface 105b constitutes a surface on a side opposite to the ABS 105a which floats over the magnetic disc.

Figure 8:
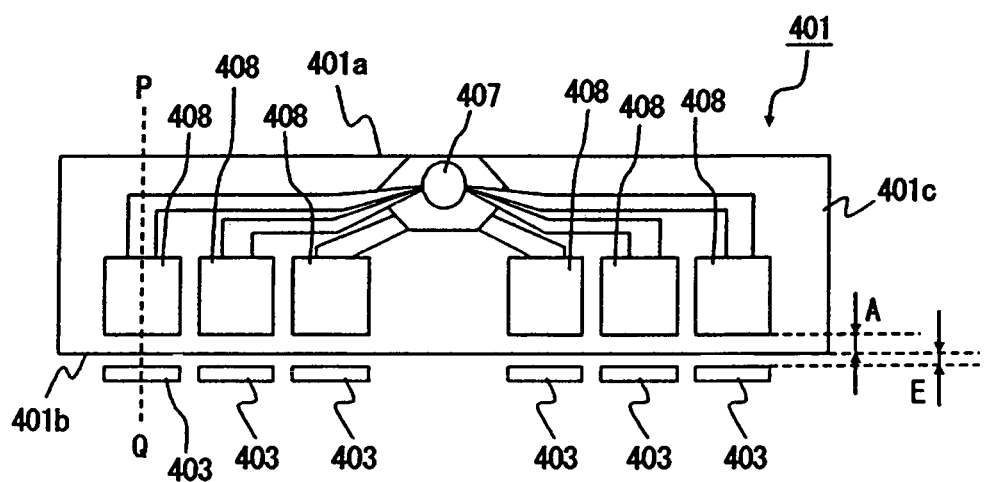
Figure 8:
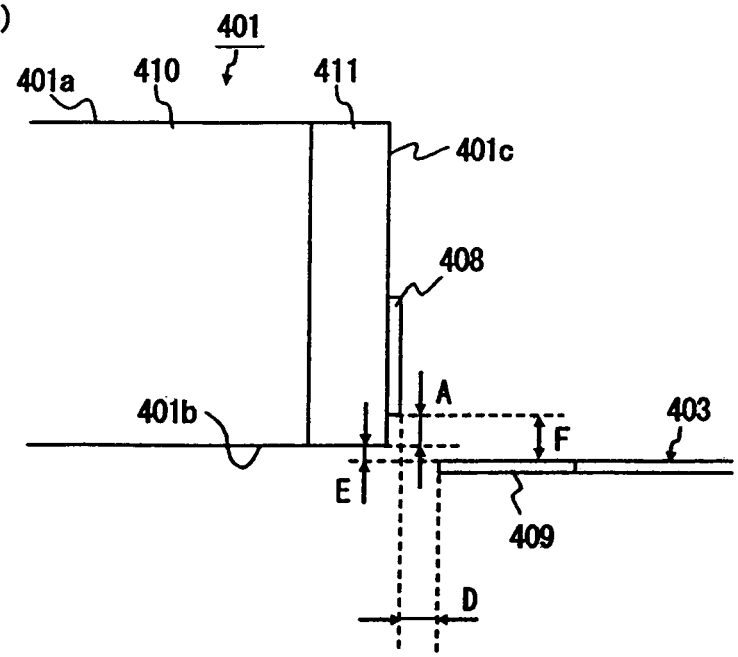

In the above-mentioned conventional head slider 401, the bonding pads 408 are formed at a position which is spaced apart from a back surface 401b of the head slider 401 by a predetermined distance A (A>0). To the contrary, the bonding pads 123 of the head slider 105 according to this embodiment are formed at a position close to the back surface 105b of the head slider 105, that is, the position where the distance A becomes A=0. Accordingly, even when a pad clearance D and a gap E between the bonding pads 204 and the head slider back surface 105c shown in FIG. 3(b) are equal to a pad clearance D and a gap E of the conventional HGA 400 shown in FIG. 8, it is possible to set a gap F between the bonding pads 123 and the bonding pads 204 smaller than the conventional HGA 400. That is, a distance (a square root of $F^2+D^2$) between the bonding pads 123 and the bonding pads 204 can be set smaller than the corresponding distance of the conventional HGA 400 and hence, the occurrence of connection failure in the solder ball bonding can be suppressed.

Subsequently, one example of manufacturing steps of the HGA 200 is explained hereinafter. First of all, manufacturing steps of the head slider 105 are explained. The head element parts 122 and the bonding pads 123 are formed on the surface of the ALTIC substrate and, thereafter, the substrate is cut into rods (referred to as row bars) in which plural element parts are arranged in a row. Here, the formation of the head element parts 122 and the bonding pads 123 is performed using photolithography. Next, by polishing cut surfaces of these row bars, the adjustment of the height is simultaneously performed with respect to the plurality of head sliders 105. Due to this polishing step, it is possible to obtain the back surface 105b of the head slider 105 and the bonding pads 123 which are formed in a state that the bonding pads 123 are brought into contact with the back surface 105b. Subsequently, using an ion milling method or the like which shaves a surface of a specimen by irradiating argon ion beams, the forming into an ABS shape is applied to the surface obtained by polishing and, thereafter, the surface is cut for every head slider as a unit. Thereafter, final forming is performed to ensure the flatness of the ABS.

The head slider 105 obtained by the above-mentioned steps is fixed to the flexure 202 using a conductive adhesive agent such as UV curing type adhesive agent. Here, in an image recognition system, there has been known an adhering device which can perform the highly accurate positioning of the head slider 105 with a positioning error of approximately ±10 μm and such a device may be also used for fixing the head slider 105.

In the conventional head slider such as the above-mentioned head slider 401 or the like, for the purpose of preventing the ESD (Electro Static Discharge) rupture of the head element part in the above-mentioned polishing step, the bonding pads 408 are formed at the position spaced apart from the back surface 401b of the head slider 401 by a predetermined distance A (A>0). In the head slider 105 of the present invention, the bonding pads 123 are arranged close to the back surface 105b of the head slider 105 and hence, there may be a case in which the occurrence of the ESD is taken into consideration. However, in such a case, by taking a counter measure to prevent the ESD rupture of the head element part, it is possible to obviate such a problem. For example, by adopting a so-called Shunting method, the polishing step may be performed in a state that the bonding pads 123 are short-circuited with each other using a conductive wire. Due to such a provision, it is possible to reduce the influence of the ESD.

Figure 4:
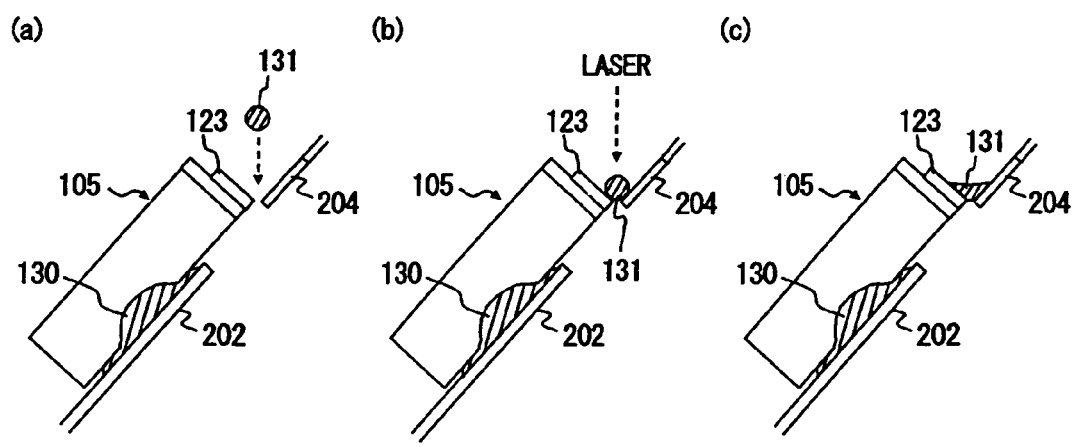
FIG. 4 illustrates a method of manufacturing the HGA according to the present invention.

FIG. 4(a) to FIG. 4(c) show the steps in which the head slider 105 is fixed by solder ball bonding the bonding pads 123 of the head slider 105 and the bonding pads 204 formed on the end portions of the leads 201. FIG. 4(a) shows the step in which the solder balls 131 which are held by suction are temporally placed on the bonding pads 123 and 204 of the HGA 200 to which the head slider 105 is fixed by the adhesive agent 130. Here, to enhance the stability of the solder balls 131 on the pads by preventing the positional displacement of the solder balls which are temporally placed on the bonding pads, the groove structure may be provided to the bonding pads 123 and 204.

FIG. 4(b) shows the step in which the solder balls are made to reflow by irradiating YAG laser beams to the solder balls which are temporally placed on the bonding pads. FIG. 4(c) shows the HGA 200 in which the bonding pads 123 and 204 are connected with each other by the solder balls 11 after the reflowing.

Here, in the above-mentioned embodiment, the explanation is made with respect to the manufacturing method which connects both pads using the solder ball bonding. However, it is possible to use other connecting methods such as a method in which solder bumps are preliminary mounted on the pads and these solder bumps are made to reflow so as to connect the pads.

Figure 5:
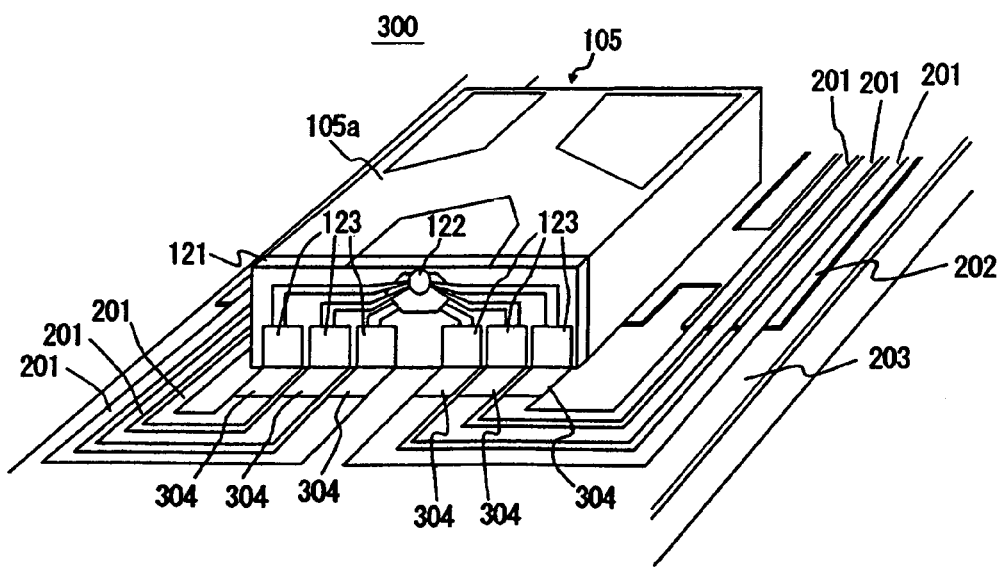
FIG. 5 illustrates perspective view of and HGA according to another aspect of the present invention.

Referring to FIG. 5, an HGA 300 constructed according to another embodiment of the invention is shown. The HGA 300 differs from the HGA 200 with respect to the point that bonding pads 304 which are formed on distal end portions of the leads 201 and are connected with the bonding pads 123 of the head slider 105 extend to a lower side of the head slider 105. Here, the other parts and structures which the HGA 300 includes are substantially equal to the corresponding parts and structure of the HGA 200 and hence their explanation is omitted.

FIG. 6(a) is a view showing a side end surface of the head slider 105 shown in FIG. 5. Further FIG. 6(b) is a cross-sectional view taken along a line P-Q in FIG. 6(a). As shown in FIGS. 6(a) and 6(b), the head slider 105 provided to the HGA 300 is identical with the head slider 105 provided to the HGA 200, while the bonding pads 123 are formed at a position where end peripheries of the bonding pads 123 are brought into contact with end peripheries of the slider side surface 105c which abuts on the slider back surface 105b, that is at a position where the distance A becomes A=0. Accordingly, it is possible to set a gap F between the bonding pads 123 and the bonding pads 304 smaller than a corresponding gap F of the conventional HGA 400. That is, it is possible to set the distance between the bonding pads 123 and the bonding pads 304 smaller than the corresponding distance of the conventional HGA 400, and hence, the occurrence of the connection failure in the solder ball bonding can be suppressed.

Further, in the HGA 300, on the back surface 105b side of the head slider 105, bonding surfaces of the bonding pads 304 which are formed on the end portions of the leads 201 and the protective film 121 of the head slider 105 are arranged to face each other in an opposed manner. In other words, the HGA 300 adopts the structure in which distal ends of the bonding pads 304 extend to a lower portion of the protective film 121 shown in FIG. 6(b). Here, in FIG. 6(b), a thickness of the protective film 121 is determined as G, and a length of the bonding pads 304 which are arranged at the lower portion of the protective film 121 is defined as C. Accordingly, the pad clearance D becomes 0. That is, the distance between the bonding pads 123 and the bonding pads 304 can be further decreased compared to the corresponding distance of the conventional HGA 400 and hence, the occurrence of connection failure in the solder ball bonding can be further suppressed.

Here, as described above, a material of the head slider body 120 is mainly ALTIC. The ALTIC possesses conductivity. Accordingly, when the bonding pads 304 extend to the lower portion of the head slider body 120, due to a contact between the bonding pads 304 and the head slider body 120, there exists a possibility that noise between a reproducing signal, a recording signal or the like may be transmitted through the leads 201. To obviate such possibility, it is desirable to set the length C of the bonding pads 304 which are positioned at the lower portion of the protective film 121 in FIG. 6(b) to a value equal to or less than the thickness G of the protective film 121 while taking a positional error at the time of fixing the head slider 105 into consideration. Due to such a provision, it is possible to obviate the contact between the bonding pads 304 and the head slider body 120.

Further, as described above, the occurrence ratio of the connection failure is changed depending on the distance between the bonding pads. Accordingly, in the HGA 300, even when the positional error at the time of fixing the head slider 105 is taken into consideration, it is desirable that the bonding pads 304 are always positioned at the lower portion of the protective film 121. As an example, assuming the thickness G of the protective film 121 as 30 μm and the positional error of the head slider 105 as ±10 μm, the length C of the bonding pads 304 positioned at the lower portion of the protective film 121 may be designed to a positioned to a value of 10 μm or more and less than 20 μm.

When the positional relationship between the head slider 105 and the leads 201 is fluctuated due to the manufacturing error at the time of fixing the head slider 105 to the flexure 202, the pad clearance always becomes zero. Accordingly, even when the fixed position of the head slider 105 is fluctuated within a range of the manufacturing error, the distance between the bonding pads is not changed and hence, this embodiment is advantageous because the fluctuation of the occurrence ratio of the connection failure is not changed. In FIG. 6(b) the bonding pads 123 are formed at a position where end peripheries of the bonding pads 123 are brought into contact with end peripheries of the slider side surface 105c. But even if the bonding pads 123 are formed apart from of the slider side surface 105c with a gap F larger compared to FIG. 6(b), the distance between the bonding pads 123 and the bonding pads 304 will be smaller when the bonding pads 304 extend to the lower portion of the head slider body 120 than a corresponding gap of the conventional HGA 400. Thus the structure of the bonding pads 304 extending to the lower portion of the head slider body 120 is effective itself.

The manufacturing steps of the HGA 300 of this embodiment are substantially equal to the manufacturing steps of the HGA 200 of the present invention. Here, at the time of fixing the head slider 105 to the flexure 202, there exists a possibility that the head slider 105 and the bonding pads 304 formed on the distal ends of the leads 201 come into contact with each other. Although this contact may influence the posture of the HGA 300 in a still state, the posture of the HGA 300 in a still state can be adjusted later and hence, this does not particularly give rise to a problem.

It is needless to say that the present invention is not limited to the above-mentioned embodiments and various modifications can be made without departing from the spirit and scope of the present invention. For example, although the HGA according to the above-mentioned embodiments adopts the structure in which the head slider is fixed to the suspension in which the flexure is supported on the load beam, the present invention is also applicable to the HGA having other structures. The present invention is widely applicable to the HGA which establishes the electrical connection between the head slider which is fixed to the suspension and the leads.

Further, the present invention is advantageously applicable not only to the connecting method using solder balls but also to other soldering connection methods such as a method in which solder bumps are preliminarily formed on pads and these solder bumps are made to reflow so as to connect pads to each other. Further, the present invention is also advantageously applicable to other connecting methods which perform the connection of pads using a conductive adhesive material besides solder.

As set forth above, the present invention is described by way of the preferred embodiment but is not limited to the above embodiment. From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A head gimbal assembly comprising:
a head slider having a head element part for reading and/or writing data between the head element part and a magnetic disc; and
a suspension on which the head slider is mounted;
wherein the head slider includes a plurality of first bonding pads of a first thickness with respect to a side surface of said head slider;
the suspension includes conductive leads which have a plurality of second bonding pads of said first thickness on one end thereof, wherein the second bonding pads are separated from said first bonding pads by a gap that is less than said first thickness and are bonded to the first bonding pads by a conductive bonding material wherein the leads are arranged in a state that the bonding surface of the second bonding pads extends to a position which faces a back surface of the head slider; and
the first bonding pads are formed on a side surface of the head slider with end peripheries of the first bonding pads contacting an end periphery of the side surface which abuts the back surface of the head slider, the back surface of the head slider being a side opposite an air bearing surface side of the head slider such that said gap between the first bonding pads and the second bonding pads are less than said thickness of the first bonding pads, such that a bottom surface of each of said first bonding pads is above and separated by a vertical gap from a top surface of each of said second bonding pads.

2. The head gimbal assembly according to claim 1, wherein the bonding material is made of solder.

3. The head gimbal assembly according to claim 1, wherein an angle which is made by a bonding surface of the first bonding pads and the bonding surface of the second bonding pads is set to approximately 90 degrees.

4. A head slider comprising:
a head element part for reading and/or writing data between the head element part and a magnetic disc;
a side surface, an air bearing surface and a back surface disposed opposite the air bearing surface, the side surface having edges abutting the back surface and the air bearing surface; and
bonding pads formed on the side surface of the head slider, with a first thickness with respect to said side surface, such that the bonding pads are contacting an end periphery of the side surface which abuts the back surface such that a closest distance between the bonding pads and a plurality of second bonding pads is less than said thickness of the first bonding pads, such that a bottom surface of each of said first bonding pads is above and separated by a vertical gap from a top surface of each of said second bonding pads.

5. A head gimbal assembly comprising:
a head slider having a head element part for reading and/or writing data from/on a magnetic disk; and
a suspension on which the head slider is mounted, wherein
the head slider has a plurality of first bonding pads formed on a side surface of the head slider and of a first thickness with respect to the side surface, the side surface being other than an air bearing surface opposed to the magnetic disk and a backside which is a reverse side of the air bearing surface;
the suspension has an electroconductive lead provided with a plurality of second bonding pads formed on one end of the electroconductive lead, and of a second thickness with respect to the one end, the second bonding pads being bonded with the first boding pads with the use of an electroconductive bonding material; and
the lead is extended to a position at which a bonding surface of the second bonding pads is opposed to the backside of the head slider, such that a distance between the first bonding pads and the second bonding pads is less than said first and second thickness, such that a bottom surface of each of said first bonding pads is above and separated by a vertical gap from a top surface of each of said second bonding pads.

6. The head gimbal assembly according to claim 5, wherein the bonding material is a solder.

7. The head gimbal assembly according to claim 5, wherein an angle formed by a bonding surface of the first bonding pads with the bonding surface of the second bonding pads is about 90 degrees.

* * * * *

UNITED STATES PATENT AND TRADEMARK OFFICE
CERTIFICATE OF CORRECTION

| | | |
|---|---|---|
| PATENT NO. | : 8,503,132 B2 | Page 1 of 1 |
| APPLICATION NO. | : 11/509972 | |
| DATED | : August 6, 2013 | |
| INVENTOR(S) | : Eiki Oosawa | |

It is certified that error appears in the above-identified patent and that said Letters Patent is hereby corrected as shown below:

On the Title Page, Item (54) and in the Specification, Column 1, Line 2, TITLE,
　　　Delete: "HEAD GIMBAL ASSEMBLY, SLIDER, AND METHOD OF MANUFACTUING A HEAD GIMBAL ASSEMBLY WITH REDUCED LEAD LENGTH"

Insert: --HEAD GIMBAL ASSEMBLY, SLIDER, AND METHOD OF MANUFACTURING A HEAD GIMBAL ASSEMBLY WITH REDUCED LEAD LENGTH--

Signed and Sealed this
Ninth Day of September, 2014

Michelle K. Lee
*Deputy Director of the United States Patent and Trademark Office*